US010705437B2

(12) United States Patent
Javaheri et al.

(10) Patent No.: US 10,705,437 B2
(45) Date of Patent: Jul. 7, 2020

(54) METROLOGY METHOD AND APPARATUS, COMPUTER PROGRAM AND LITHOGRAPHIC SYSTEM

(71) Applicant: ASML Netherlands B.V., Veldhoven (NL)

(72) Inventors: Narjes Javaheri, Eindhoven (NL); Mohammadreza Hajiahmadi, Rotterdam (NL); Murat Bozkurt, Uden (NL); Alberto Da Costa Assafrao, Veldhoven (NL); Marc Johannes Noot, Eindhoven (NL); Simon Gijsbert Josephus Mathijssen, Rosmalen (NL); Jin Lian, Eindhoven (NL)

(73) Assignee: ASML Netherlands B.V, Veldhoven (NL)

( * ) Notice: Subject to any disclaimer, the term of this patent is extended or adjusted under 35 U.S.C. 154(b) by 0 days.

(21) Appl. No.: 16/155,424

(22) Filed: Oct. 9, 2018

(65) Prior Publication Data
US 2019/0107785 A1 Apr. 11, 2019

(30) Foreign Application Priority Data

Oct. 10, 2017 (EP) .................................... 17195664
Dec. 21, 2017 (EP) .................................... 17209775
Jan. 25, 2018 (EP) .................................... 18153470

(51) Int. Cl.
*G03F 7/20* (2006.01)
*G01N 21/47* (2006.01)
(Continued)

(52) U.S. Cl.
CPC .......... *G03F 7/70633* (2013.01); *G01B 11/24* (2013.01); *G01B 11/30* (2013.01);
(Continued)

(58) Field of Classification Search
CPC ........ G01B 11/24; G01B 11/30; G01N 21/47; G03F 7/705; G03F 7/70625; G03F 7/70633; G03F 7/70641
(Continued)

(56) References Cited

U.S. PATENT DOCUMENTS 6,281,974 B1  8/2001  Scheiner et al.
6,429,930 B1  8/2002  Littau et al.
(Continued)

FOREIGN PATENT DOCUMENTS

CN  107077079 A  8/2017
EP  3 401 733 A1  11/2018
(Continued)

OTHER PUBLICATIONS

International Search Report and Written Opinion of the International Searching Authority directed to related International Patent Application No. PCT/EP2018/077479, dated Feb. 25, 2019; 14 pages.

*Primary Examiner* — Colin W Kreutzer
(74) *Attorney, Agent, or Firm* — Sterne, Kessler, Goldstein & Fox P.L.L.C.

(57) ABSTRACT

Disclosed is a method, and associated apparatuses, for measuring a parameter of interest relating to a structure having at least two layers. The method comprises illuminating the structure with measurement radiation and detecting scattered radiation having been scattered by said structure. The scattered radiation comprises normal and complementary higher diffraction orders. A scatterometry model which relates a scattered radiation parameter to at least a parameter of interest and an asymmetry model which relates the scattered radiation parameter to at least one asymmetry parameter are defined, the asymmetry parameter relating to one or more measurement system errors and/or an asymmetry in the target other than a misalignment between (Continued)

the two layers. A combination of the scatterometry model and asymmetry model is used to determine a system of equations, and the system of equations is then solved for the parameter of interest.

15 Claims, 6 Drawing Sheets

(51) Int. Cl.
  *G01B 11/24* (2006.01)
  *G01B 11/30* (2006.01)
  *H01L 23/544* (2006.01)
(52) U.S. Cl.
  CPC ............ *G01N 21/47* (2013.01); *G03F 7/705* (2013.01); *G03F 7/70625* (2013.01); *G03F 7/70641* (2013.01); *H01L 23/544* (2013.01)
(58) Field of Classification Search
  USPC ..................................... 355/77; 356/399–401
  See application file for complete search history.

(56) References Cited

U.S. PATENT DOCUMENTS

| | | |
|---|---|---|
| 6,476,920 B1 | 11/2002 | Scheiner et al. |
| 6,606,152 B2 | 8/2003 | Littau et al. |
| 6,704,661 B1 | 3/2004 | Opsal et al. |
| 6,778,911 B2 | 8/2004 | Opsal et al. |
| 6,801,321 B1 | 10/2004 | Du Nour |
| 6,836,324 B2 | 12/2004 | Scheiner et al. |
| 6,856,408 B2 | 2/2005 | Raymond |
| 6,931,361 B2 | 8/2005 | Opsal et al. |
| 6,947,850 B2 | 9/2005 | Opsal et al. |
| 7,031,848 B2 | 4/2006 | Opsal et al. |
| 7,099,005 B1 | 8/2006 | Fabrikant et al. |
| 7,123,366 B2 | 10/2006 | Scheiner et al. |
| 7,187,456 B2 | 3/2007 | Scheiner et al. |
| 7,230,704 B2 | 6/2007 | Sezginer et al. |
| 7,265,571 B2 | 9/2007 | Srocka |
| 7,301,649 B2 | 11/2007 | Fabrikant et al. |
| 7,508,976 B1 | 3/2009 | Yang et al. |
| 7,511,830 B2 | 3/2009 | Fabrikant et al. |
| 7,515,279 B2 | 4/2009 | Raymond |
| 7,564,555 B2 | 7/2009 | Den Boef et al. |
| 7,639,371 B2 | 12/2009 | Raymond |
| 7,791,727 B2 | 9/2010 | Den Boef et al. |
| 7,791,732 B2 | 9/2010 | Den Boef et al. |
| 7,821,654 B2 | 10/2010 | Fabrikant et al. |
| 8,054,467 B2 | 11/2011 | Den Boef et al. |
| 8,553,230 B2 | 10/2013 | Den Boef et al. |
| 8,760,662 B2 | 6/2014 | Den Boef et al. |
| 9,223,227 B2 | 12/2015 | Bhattacharyya et al. |
| 9,239,523 B2 | 1/2016 | Li et al. |
| 9,704,810 B2 | 7/2017 | Den Boef |
| 9,869,940 B2 | 1/2018 | Zeng et al. |
| 9,874,527 B2 | 1/2018 | Amit et al. |
| 9,897,553 B2 | 2/2018 | Barak et al. |
| 9,940,703 B2 | 4/2018 | Bozkurt et al. |
| 2006/0033921 A1 | 2/2006 | Den Boef et al. |
| 2011/0027704 A1 | 2/2011 | Cramer et al. |
| 2011/0043791 A1 | 2/2011 | Smilde et al. |
| 2012/0242970 A1 | 9/2012 | Smilde et al. |
| 2013/0054186 A1 | 2/2013 | Den Boef |
| 2016/0161863 A1 | 6/2016 | Den Boef et al. |
| 2016/0291481 A1 | 10/2016 | Smilde et al. |
| 2016/0313654 A1* | 10/2016 | Zeng .................... G01B 11/272 |

FOREIGN PATENT DOCUMENTS

| | | |
|---|---|---|
| WO | WO 2009/078708 A1 | 6/2009 |
| WO | WO 2009/106279 A1 | 9/2009 |
| WO | WO 2011/012624 A1 | 2/2011 |
| WO | WO 2013/143814 A1 | 10/2013 |
| WO | WO 2018/202388 A1 | 11/2018 |
| WO | WO 2018/206227 A1 | 11/2018 |

\* cited by examiner

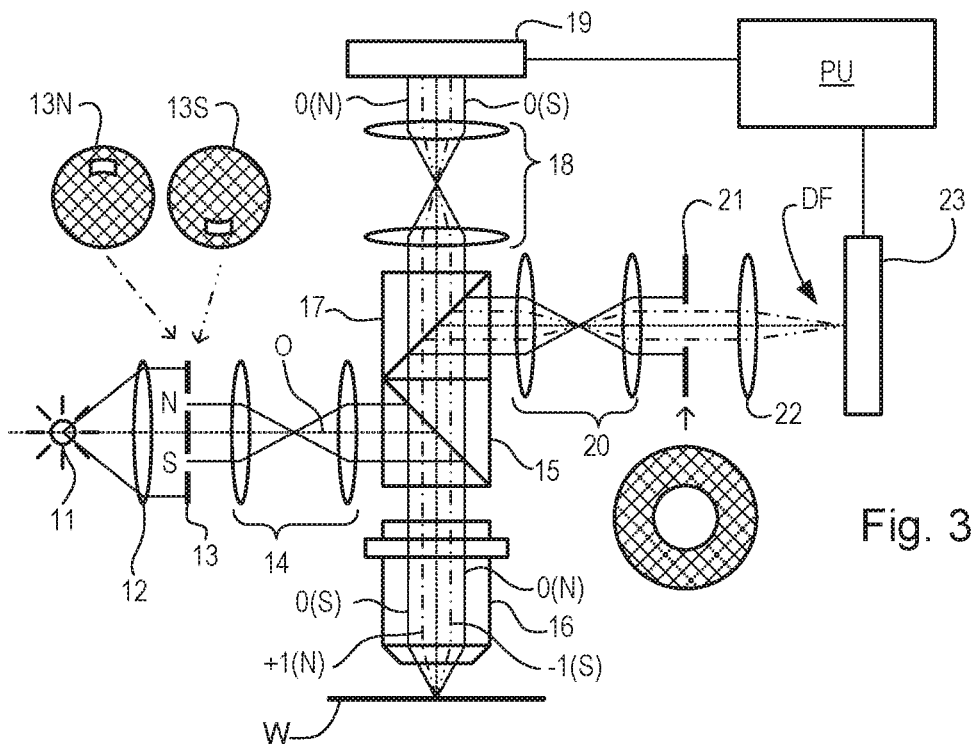
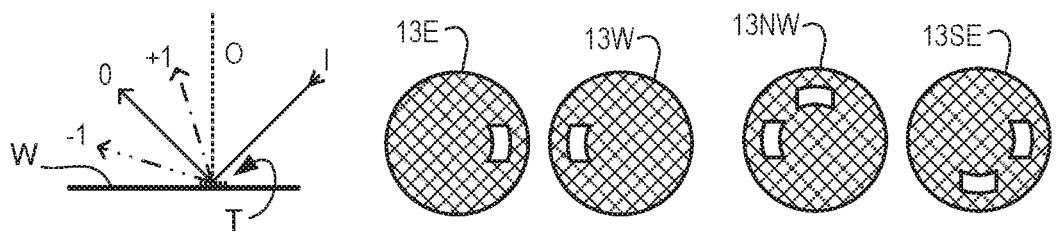
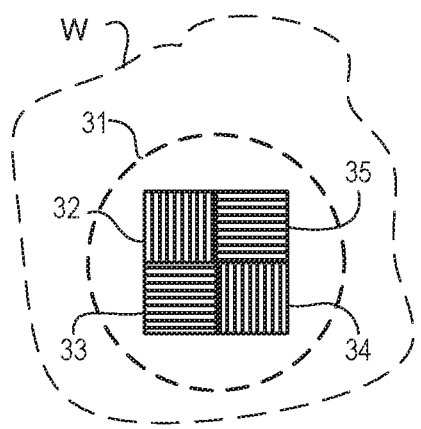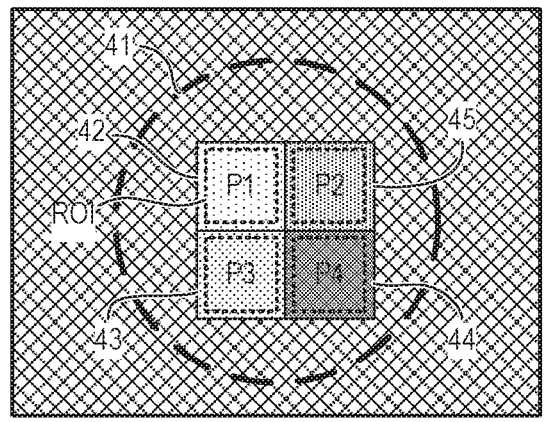
Fig. 3(b)   Fig. 3(c)   Fig. 3(d)
Fig. 4   Fig. 5

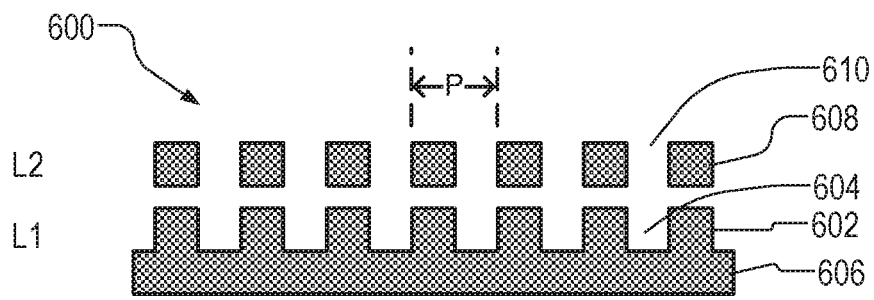
Fig. 7(a)
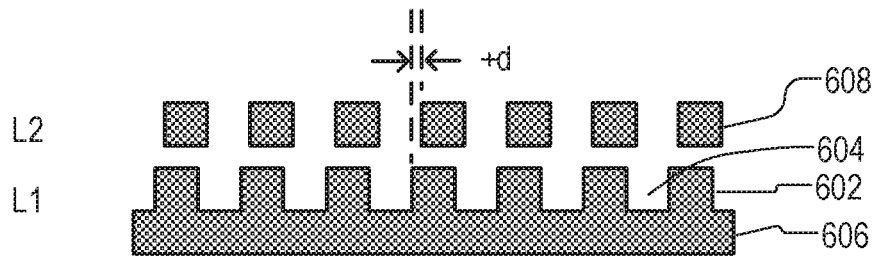
Fig. 7(b)
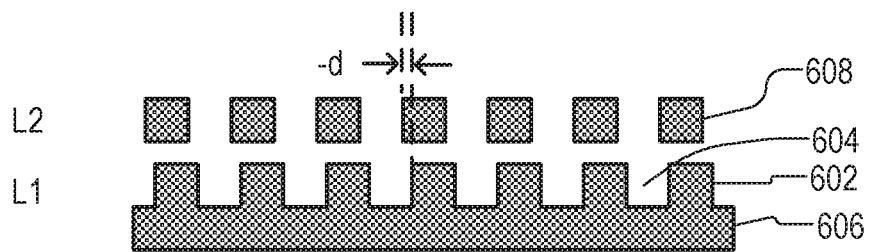
Fig. 7(c)
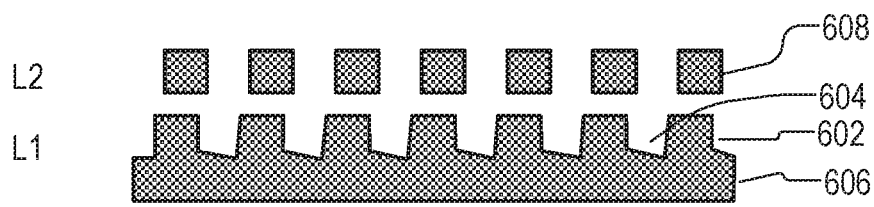
Fig. 7(d)
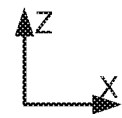

METROLOGY METHOD AND APPARATUS, COMPUTER PROGRAM AND LITHOGRAPHIC SYSTEM

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target structure and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The target structures used by conventional scatterometers are relatively large, e.g., 40 µm by 40 µm, gratings and the measurement beam generates a spot that is smaller than the grating (i.e., the grating is underfilled). This simplifies mathematical reconstruction of the target structure as it can be regarded as infinite. However, in order to reduce the size of the target structures, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such target structures are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller target structures. These target structures can be smaller than the illumination spot and may be surrounded by product structures on a wafer. Target structures can comprise multiple targets which can be measured in one image.

In the known metrology technique, overlay measurement results are obtained by measuring the target structure twice under certain conditions, while either rotating the target structure or changing the illumination mode or imaging mode to obtain separately the $-1^{st}$ and the $+1^{st}$ diffraction order intensities. The intensity asymmetry, a comparison of these diffraction order intensities, for a given target structure provides a measurement of target asymmetry, that is asymmetry in the target structure. This asymmetry in the target structure can be used as an indicator of overlay error (undesired misalignment of two layers).

Although the known dark-field image-based overlay measurements are fast and computationally very simple (once calibrated), they rely on an assumption that overlay (i.e., overlay error and deliberate bias) is the only cause of target asymmetry in the target structure. Any other asymmetry in the target structure, such as structural asymmetry of features within one or both of the overlaid gratings, also causes an intensity asymmetry in the $1^{st}$ (or other higher) orders. This intensity asymmetry attributable to structural asymmetry, and which is not related to overlay, clearly perturbs the overlay measurement, giving an inaccurate overlay measurement. Asymmetry in the lowermost or bottom grating of a target structure is a common form of structural asymmetry. It may originate for example in wafer processing steps such as chemical-mechanical polishing (CMP), performed after the bottom grating was originally formed.

Also sensor errors (e.g., errors is a sensor or detector used to detect scattered radiation from a target) are typically calibrated for by performing one or more offline sensor calibration steps. However, these calibration steps can be time consuming, and can introduce other calibration errors which in some circumstances can actually make any measurement error worse.

Therefore, it is desired to distinguish the contributions to asymmetry measurements that are caused by overlay error and other effects such as process induced structural asymmetry and/or sensor errors in a more direct and accurate way.

SUMMARY OF THE INVENTION

The invention in a first aspect provides a method of measuring a parameter of interest relating to a structure having at least two layers, comprising: illuminating the structure with measurement radiation and detecting scattered radiation having been scattered by said structure, wherein the scattered radiation comprises normal and complementary higher diffraction orders; defining a scatterometry model and an asymmetry model relating to the structure, wherein: said scatterometry model relates a scattered radiation parameter to at least a parameter of interest; and said asymmetry model relates the scattered radiation parameter to at least one asymmetry parameter, said at least one asymmetry parameter relating to one or more measurement system errors and/or an asymmetry in the target other than a misalignment between the two layers; using a combination of the scatterometry model and asymmetry model to determine a system of equations, each equation of said system of equations relating to a different measurement value of a set of measurement values for said scattered radiation parameter, said set of measurement values comprising at least a different measurement value for each of said normal and complementary higher diffraction orders; and solving said system of equations for said parameter of interest.

The invention further provides an inspection apparatus for measuring a parameter of interest of a lithographic process, the inspection apparatus being operable to perform the method of the first aspect.

The invention further provides a non-transitory computer program product comprising processor readable instructions which, when run on suitable processor controlled apparatus, cause the processor controlled apparatus to perform the method of the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 3(a)-3(d) comprise 3(a) a schematic diagram of a dark field scatterometer for use in measuring targets according to embodiments of the invention using a first pair of illumination apertures, 3(b) a detail of diffraction spectrum of a target grating for a given direction of illumination 3(c) a second pair of illumination apertures providing further illumination modes in using the scatterometer for diffraction based overlay measurements and 3(d) a third pair of illumination apertures combining the first and second pair of apertures;

FIG. 4 depicts a known form of multiple grating target structure and an outline of a measurement spot on a substrate;

FIG. 5 depicts an image of the target of FIG. 4 obtained in the scatterometer of FIG. 3;

FIGS. 7(a) to 7(c) show schematic cross-sections of overlay gratings having different overlay values in the region of zero;

FIG. 7(d) is a schematic cross-section of an overlay grating having structural asymmetry in a bottom grating due to processing effects;

DETAILED DESCRIPTION OF EXEMPLARY EMBODIMENTS

Before describing embodiments of the invention in detail, it is instructive to present an example environment in which embodiments of the present invention may be implemented.

Figure 1:
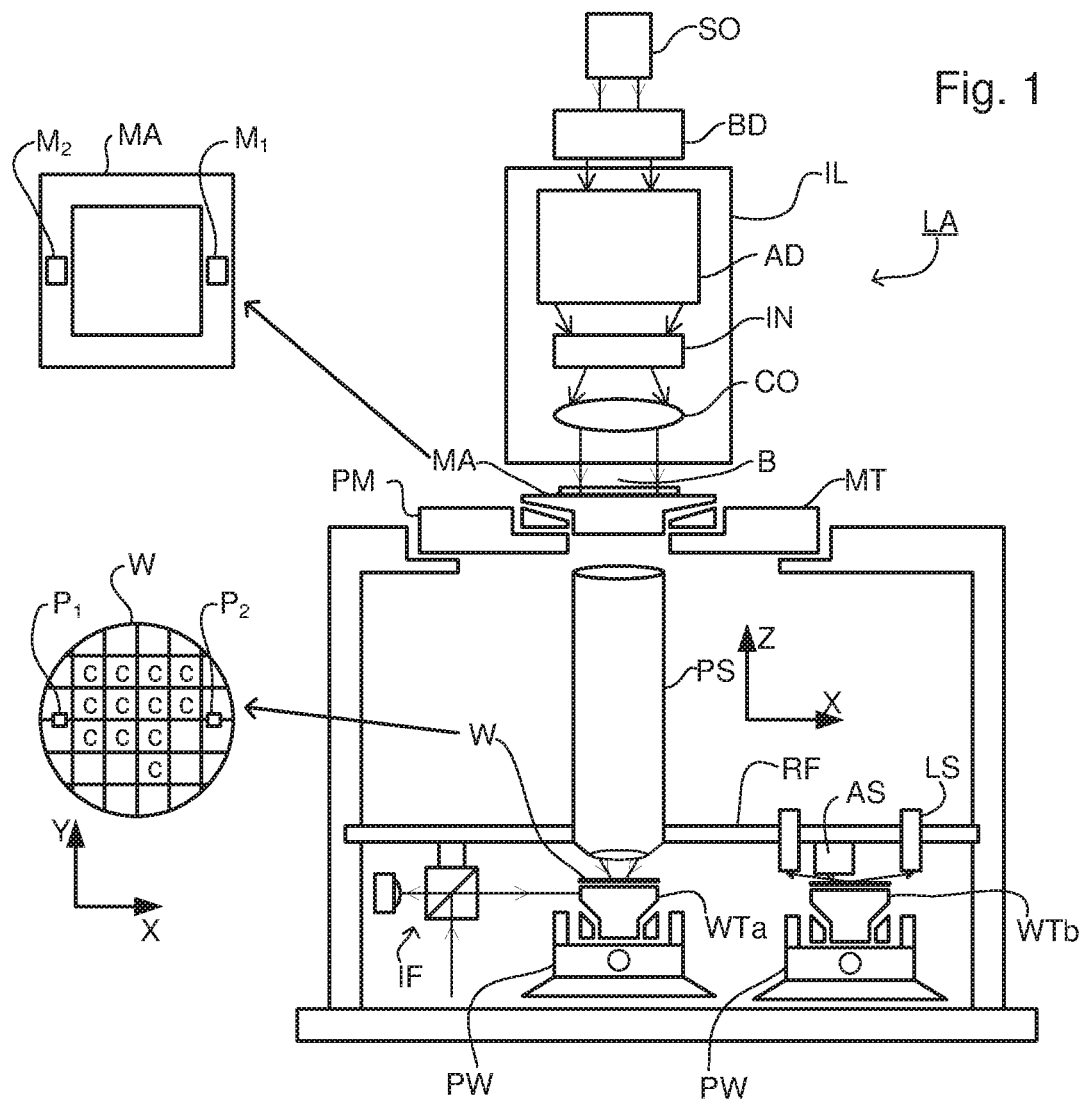
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
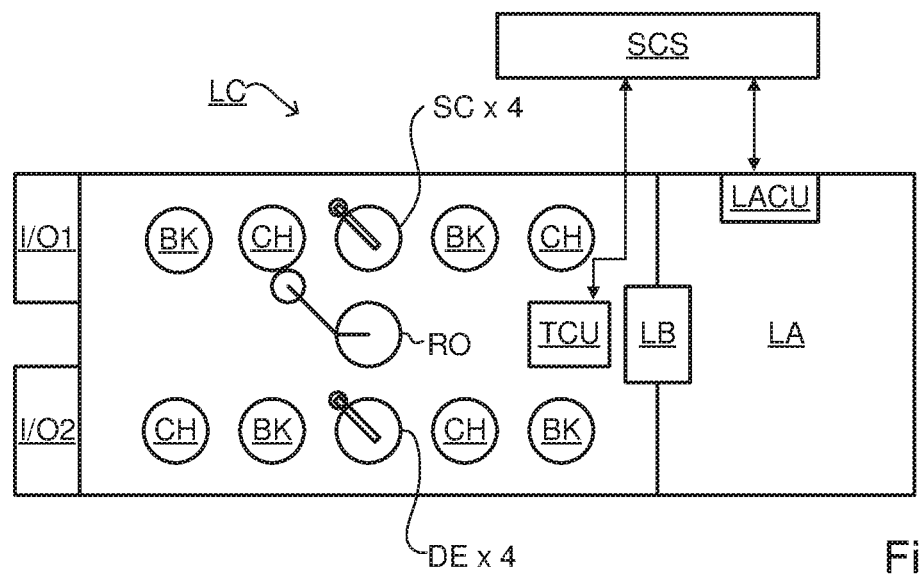
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

A metrology apparatus suitable for use in embodiments of the invention is shown in FIG. 3(a). A target structure T and diffracted rays of measurement radiation used to illuminate the target structure are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target structure T is placed with substrate W normal to the optical axis O of objective lens 16. The substrate W may be supported by a support (not shown). A ray of measurement radiation I impinging on target structure T from an angle off the axis O gives rise to a zeroth order ray (solid line 0) and two first order rays (dot-chain line +1 and double dot-chain line −1). It should be remembered that with an overfilled small target structure, these rays are just one of many parallel rays covering the area of the substrate including metrology target structure T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the target structures and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target structure T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target structure on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target structure T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

FIG. 4 depicts a target structure or composite target formed on a substrate according to known practice. The target structure in this example comprises four targets (e.g., gratings) 32 to 35 positioned closely together so that they will all be within a measurement spot 31 formed by the metrology radiation illumination beam of the metrology apparatus. The four targets thus are all simultaneously illuminated and simultaneously imaged on sensors 19 and 23. In an example dedicated to measurement of overlay, targets 32 to 35 are themselves composite gratings formed by overlying gratings that are patterned in different layers of the semi-conductor device formed on substrate W. Targets 32 to 35 may have differently biased overlay offsets in order to facilitate measurement of overlay between the layers in which the different parts of the composite gratings are formed. The meaning of overlay bias will be explained below with reference to FIG. 7. Targets 32 to 35 may also differ in their orientation, as shown, so as to diffract incoming radiation in X and Y directions. In one example, targets 32 and 34 are X-direction gratings with biases of the +d, −d, respectively. Targets 33 and 35 are Y-direction gratings with offsets +d and −d respectively. Separate images of these gratings can be identified in the image captured by sensor 23. This is only one example of a target structure. A target structure may comprise more or fewer than 4 targets, or only a single target.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual targets 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of targets 32 to 35. In this way, the images do not have to be aligned very precisely at a specific location within the sensor frame, which greatly improves throughput of the measuring apparatus as a whole.

Once the separate images of the targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
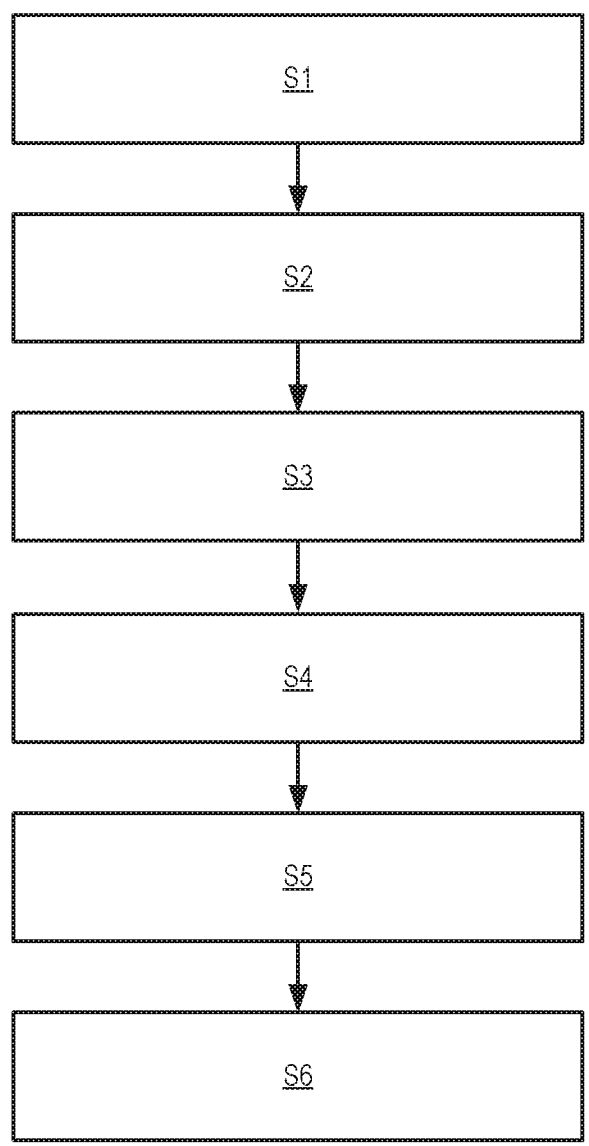
FIG. 6 is a flowchart showing the steps of an overlay measurement method using the scatterometer of FIG. 3 and adaptable to form embodiments of the present invention.

FIG. 6 illustrates how, using for example the method described in application WO 2011/012624, overlay error (i.e., undesired and unintentional overlay misalignment) between the two layers containing the component targets 32 to 35 is measured. This measurement is done through target asymmetry, as revealed by comparing their intensities in normal and complementary higher diffraction orders; e.g., the +1 order and −1 order dark field images (the intensities of other corresponding higher orders can be compared, e.g. +2 and −2 orders) to obtain a measure of the intensity asymmetry. At step S1, the substrate, for example a semiconductor wafer, is processed through a lithographic apparatus, such as the lithographic cell of FIG. 2, one or more times, to create a target structure including the targets 32-35. At S2, using the metrology apparatus of FIG. 3, an image of the targets 32 to 35 is obtained using only one of the first order diffracted beams (say −1). At step S3, whether by changing the illumination mode, or changing the imaging mode, or by rotating substrate W by 180° in the field of view of the metrology apparatus, a second image of the targets using the other first order diffracted beam (+1) can be obtained. Consequently the +1 diffracted radiation is captured in the second image.

Note that, by including only half of the first order diffracted radiation in each image, the 'images' referred to here are not conventional dark field microscopy images. The individual target lines of the targets will not be resolved. Each target will be represented simply by an area of a certain intensity level. In step S4, a region of interest (ROI) is identified within the image of each component target, from which intensity levels will be measured.

Having identified the ROI for each individual target and measured its intensity, the asymmetry of the target structure, and hence overlay error, can then be determined. This is done (e.g., by the processor PU) in step S5 comparing the intensity values obtained for +1 and −1 orders for each target 32-35 to identify their intensity asymmetry, e.g., any difference in their intensity. The term "difference" is not intended to refer only to subtraction. Differences may be calculated in ratio form. In step S6 the measured intensity asymmetries for a number of targets are used, together with knowledge of any known imposed overlay biases of those targets, to calculate one or more performance parameters of the lithographic process in the vicinity of the target structure T. In the applications described herein, measurements using two or more different measurement recipes will be included. A performance parameter of great interest is overlay. As will be described later, the novel methods also allow other parameters of performance of the lithographic process to be calculated. These can be fed back for improvement of the lithographic process, and/or used to improve the measurement and calculation process of FIG. 6 itself.

In the prior applications, mentioned above, various techniques are disclosed for improving the quality of overlay measurements using the basic method mentioned above. These techniques will not be explained here in further detail. They may be used in combination with the techniques newly disclosed in the present application, which will now be described.

FIG. 7 shows schematic cross sections of targets (overlay gratings), with different biases. These can be used as the target structure T on substrate W, as seen in FIGS. 3 and 4. Gratings with periodicity in the X direction are shown for the sake of example only. Different combinations of these gratings with different biases and with different orientations can be provided separately or as part of a target structure.

Starting with FIG. 7(a) a target 600 formed in two layers, labeled L1 and L2, is shown. In the lowermost or bottom layer L1, a first structure (the lowermost or bottom structure), for example a grating, is formed by features 602 and spaces 604 on a substrate 606. In layer L2 a second structure, for example a grating, is formed by features 608 and spaces 610. (The cross-section is drawn such that the features 602, 608 (e.g., lines) extend into the page.) The grating pattern repeats with a pitch P in both layers. Features 602 and 608 may take the form of lines, dots, blocks and via holes. In the situation shown at (a), there is no overlay contribution due to misalignment, e.g., no overlay error and no imposed bias, so that each feature 608 lies exactly over a feature 602 in the first structure.

At FIG. 7(b), the same target with a first known imposed bias +d is shown, such that the features 608 of the first structure are shifted by a distance d to the right, relative to the features of the second structure. The bias distance d might be a few nanometers in practice, for example 10 nm-20 nm, while the pitch P is for example in the range 300-1000 nm, for example 500 nm or 600 nm. At (c) we see another feature with a second known imposed bias −d, such that the features of 608 are shifted to the left. Biased targets of this type shown at (a) to (c) are well known in the art, and used in the prior applications mentioned above.

FIG. 7(d) shows schematically a phenomenon of structural asymmetry, in this case structural asymmetry in the first structure (bottom grating asymmetry). The features in the gratings at (a) to (c), are shown as perfectly square-sided, when a real feature would have some slope on the side, and a certain roughness. Nevertheless they are intended to be at least symmetrical in profile. The features 602 and/or spaces 604 at (d) in the first structure no longer have a symmetrical form at all, but rather have become distorted by processing steps. Thus, for example, a bottom surface of each space has become tilted. Side wall angles of the features and spaces have become asymmetrical also. As a result of this, the overall target asymmetry of a target will comprise an overlay contribution independent of structural asymmetry (i.e., an overlay contribution due to misalignment of the first structure and second structure, itself comprised of overlay and any known imposed bias) and a structural contribution due to this structural asymmetry in the target.

When overlay is measured by the method of FIG. 6 using only two biased gratings, the process-induced structural asymmetry cannot be distinguished from the overlay contribution due to misalignment, and overlay measurements (in particular to measure the undesired overlay) become unreliable as a result. Structural asymmetry in the first structure (bottom grating) of a target structure is a common form of structural asymmetry. It may originate, for example, in the substrate processing steps such as chemical-mechanical polishing (CMP), performed after the first structure was originally formed.

In WO 2013143814 A1, it is proposed to use of three or more component targets to measure overlay by a modified version of the method of FIG. 6. Using three or more targets of the type shown in FIGS. 7(a) to (c) are used to obtain overlay measurements that are to some extent corrected for structural asymmetry in the target gratings, such as is caused by bottom grating asymmetry in a practical lithographic process. However, this method requires a new target structure design (e.g. different to that illustrated in FIG. 4) and therefore a new reticle will be required. Furthermore, the target structure area is larger and therefore consumes more substrate area. In addition, the phase element of the overlay contribution resultant from structural asymmetry is ignored in this and other prior art methods, meaning that the corrections are not as accurate as they could be if the phase element was also corrected for.

Figure 8:
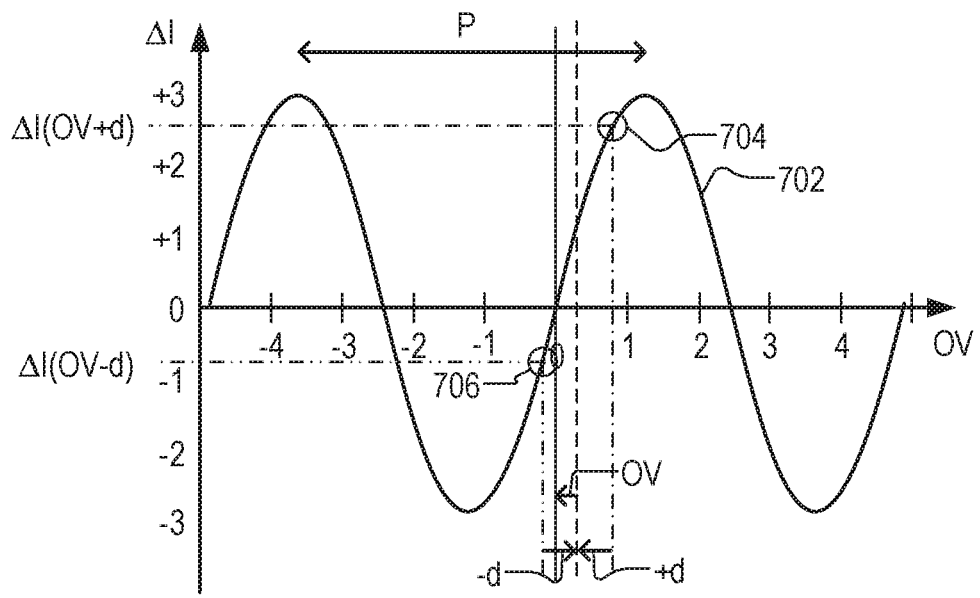
FIG. 8 illustrates known principles of overlay measurement in an ideal target structure, not subject to structural asymmetry.
Figure 9:
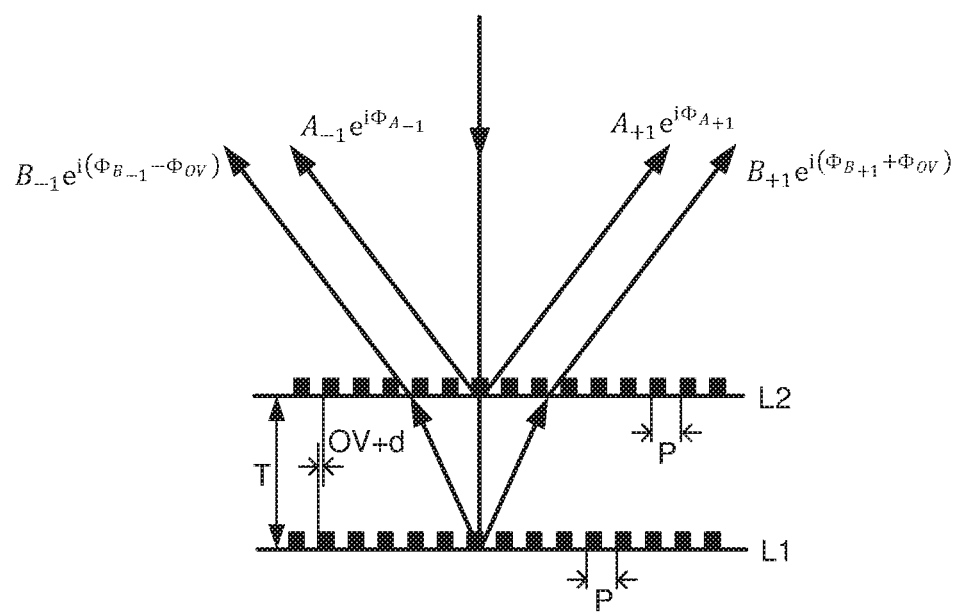
FIG. 9 is a schematic depiction of a simple model for describing diffraction of radiation from a target with a two-layer target.

In FIG. 8 a curve 702 illustrates the relationship between overlay OV and intensity asymmetry ΔI for an 'ideal' target structure having zero offset and no structural asymmetry within the individual gratings forming the target structure. Consequently, the target asymmetry of this ideal target structure comprises only an overlay contribution due to misalignment of the first structure and second structure resultant from a known imposed bias and overlay OV. This graph, and the graph of FIG. 9, is to illustrate the principles behind the disclosure only, and in each graph, the units of intensity asymmetry ΔI and overlay OV are arbitrary. Examples of actual dimensions will be given further below.

In the 'ideal' situation of FIG. 8, the curve 702 indicates that the intensity asymmetry ΔI has a non-linear periodic relationship (e.g., sinusoidal relationship) with the overlay. The period P of the sinusoidal variation corresponds to the period or pitch P of the gratings, converted of course to an appropriate scale. The sinusoidal form is pure in this example, but can include harmonics in real circumstances.

As mentioned above, biased gratings (having a known imposed overlay bias) can be used to measure overlay, rather than relying on a single measurement. This bias has a known value defined in the patterning device (e.g. a reticle) from which it was made, that serves as an on-wafer calibration of the overlay corresponding to the measured intensity asymmetry. In the drawing, the calculation is illustrated graphically. In steps S1-S5, intensity asymmetry measurements $\Delta I^{+d}/d$ and $\Delta I^{-d}$ are obtained for targets having imposed biases +d an −d respectively (as shown in FIGS. 7 (b) and (c), for example). Fitting these measurements to the sinusoidal curve gives points 704 and 706 as shown. Knowing the biases, the true overlay error $OV_E$ can be calculated. The pitch P of the sinusoidal curve is known from the design of the target structure. The vertical scale of the curve 702 is not known to start with, but is an unknown factor which can be referred to as a $1^{st}$ harmonic proportionality constant, $K_1$. This constant $K_1$ is a measure of the sensitivity of the intensity asymmetry measurements to the target structure.

In equation terms, the relationship between overlay OV and intensity asymmetry ΔI is assumed to be:

$$\Delta I_{\pm d} = K_1 \sin(OV \pm d) \quad (1)$$

where overlay OV is expressed on a scale such that the target pitch P corresponds to an angle 2π radians. Using two measurements of targets with different, known biases (e.g. +d and −d) the overlay OV can be calculated using:

$$OV = \operatorname{atan}\left(\frac{\Delta I_{+d} + \Delta I_{-d}}{\Delta I_{+d} - \Delta I_{-d}} \cdot \tan(d)\right) \quad (2)$$

FIG. 9 is schematic depiction of a simple model for describing diffraction of radiation from a target (such as a sub-target 32 or 33, being shown here with a +d bias) with a two-layer target (such as shown in FIGS. 7(a)-7(c)). The complex amplitude of diffracted radiation from the upper layer and lower layer are shown. Diffracted radiation from the lower layer includes a phase contribution from overlay OV. The overlay OV can also be evaluated. Specifically, the intensities of the +1$^{st}$ and −1$^{st}$ order of diffracted radiation can be calculated as follows (Equation 3):

$$I_{+L} = \left|A_{+1}e^{i\Phi_{A_{+1}}} + B_{+1}e^{i(\Phi_{B_{+1}}+\Phi_{OV})}\right|^2 =$$
$$A_{+1}^2 + B_{+1}^2 + 2A_{+1}B_{+1} \times \cos[\Phi_{A_{+1}} - \Phi_{B_{+1}} - \Phi_{OV}]$$
$$I_{-L} = \left|A_{-1}e^{i\Phi_{A_{-1}}} + B_{-1}e^{i(\Phi_{B_{-1}}-\Phi_{OV})}\right|^2 =$$
$$A_{-1}^2 + B_{-1}^2 + 2A_{-1}B_{-1} \times \cos[\Phi_{A_{-1}} - \Phi_{B_{-1}} + \Phi_{OV}]$$

where $$\Phi_{OV} = \frac{2\pi}{P}(OV \pm d)$$

is the phase difference due to overlay and bias and $$\Phi_A - \Phi_B = \beta \propto 4\pi \frac{T}{\lambda}$$

is the remainder of the phase difference between diffracted radiation from the upper layer L2 and lower layer L1, which is proportional to the thickness T of the layer between the upper and lower targets and inversely proportional to the wavelength of the incident radiation.

For convenience, the four intensities of one target direction (e.g. X) can be designated as follows:

$I_{+1}^{+d}$ is the +1st diffraction order from positive bias target;

$I_{-1}^{+d}$ is the −1st diffraction order from positive bias target;

$I_{+1}^{-d}$ is the +1st diffraction order from negative bias target; and $I_{-1}^{-d}$ is the −1st diffraction order from negative bias target So, intensity asymmetry $\Delta I^{+d} = I_{+1}^{+d} - I_{-1}^{+d}$ if and intensity asymmetry $\Delta I^{-d} = I_{+1}^{-d} - I_{-1}^{-d}$. Then, with the assumption that the amplitude and phase (excluding overlay phase) of diffracted waves from the +1st and −1st order radiation and also from positive bias and negative bias targets are equal, and the optics of the metrology device is symmetric itself, a difference between intensity of +1st and −1st order radiation is derived as $\Delta I = K \cdot \sin(\Phi_{OV})$, with K being overlay proportionality equal to $K = 4 A \cdot B \cdot \sin(\beta)$. Hence, the overlay can be calculated as follows:

$$OV = \frac{P}{2\pi}\tan^{-1}\left(\tan\left(\frac{2\pi d}{P}\right) \cdot \frac{\Delta I^{+d} + \Delta I^{-d}}{\Delta I^{+d} - \Delta I^{-d}}\right) \quad (4)$$

Figure 10:
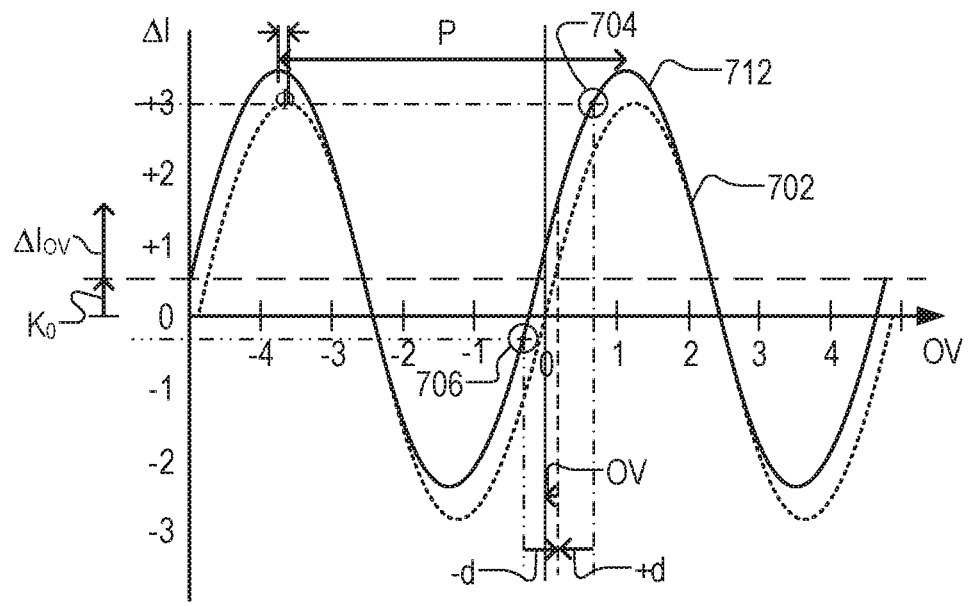
FIG. 10 illustrates a principle of overlay measurement in a non-ideal target structure, with correction of structural asymmetry as disclosed in embodiments of the invention.

FIG. 10 shows a first effect of introducing structural asymmetry, for example the bottom grating asymmetry illustrated in FIG. 7(d). The 'ideal' sinusoidal curve 702 no longer applies. However, at least approximately, bottom grating asymmetry or other structural asymmetry has the effect of adding an intensity shift term $K_0$ and a phase shift term $\Phi$ to the intensity asymmetry $\Delta I_{\pm d}$. The resulting curve is shown as 712 in the diagram, with label $K_0$ indicating the intensity shift term, and label $\Phi$ indicating the phase offset term. Intensity shift term $K_0$ and phase shift term $\Phi$ are dependent upon a combination of the target structure and a selected characteristic of the measurement radiation, such as the wavelength and/or polarization and/or angle of incidence of the measurement radiation (the "measurement recipe"), and is sensitive to process variations. In equation terms, the relationship used for calculation in step S6 becomes:

$$\Delta I^{\pm d} = K_0 + K_1 \sin(OV_E \pm d + \Phi) \quad (5)$$

Where there is structural asymmetry, the overlay model described by Equation (2) will provide overlay error values which are impacted by the intensity shift term $K_0$ and phase shift term $\Phi$, and will be inaccurate as a consequence. The structural asymmetry will also result in differences in measurements of the same target using one or more different measurement recipes (e.g., wavelength of the measurement beam, polarization of the measurement beam, etc.), when mapping the overlay error, because intensity and phase shift are, e.g., measurement recipe dependent.

The overlay calculations of step S6 rely on certain assumptions. Firstly, it is assumed intensity asymmetry behaves as a sine function of the overlay, with the period P corresponding to the grating pitch. These assumptions are valid for present overlay ranges. The number of harmonics can be designed to be small, because the small pitch-wavelength ratio only allows for a small number of propagating diffraction orders from the grating. However, in practice the overlay contribution to the intensity asymmetry due to misalignment may not necessarily be truly sinusoidal, and may not necessarily be completely symmetrical about OV=0.

So, the effect of structural asymmetry can be generally formulated as:

$$\Delta I^{+d} = K(OV+d) + \Delta I_{BG} \quad (6)$$

$$\Delta I^{-d} = K(OV-d) + \Delta I_{BG} \quad (7)$$

where $\Delta I_{BG}$ is the contribution to the intensity asymmetry of the structural asymmetry. And therefore, overlay OV can be considered as a function of $\Delta I_{BG}/K$.

Another issue which affects overlay measurements are asymmetries and other errors in the sensor. To address these, several calibration steps are typically performed at an image (pixel) level, between acquisition of an image in the sensor's camera to final calculation of parameters such as overlay and focus. Such calibration steps may include calibrations for: dark current offset of camera, CCD non-linearity, internal and external ghosts and spot inhomogeneity. Subsequently, the corrected image is imported to a pattern recognition algorithm for signal extraction and the mean intensity values are reported. Subsequent to this, inline sensor asymmetry calibrations may be applied to the mean intensities in order to correct for the remaining sensor errors that are target and stack dependent.

An issue with such a calibration method for removing sensor errors is that each calibration step may introduce a calibration error and consequently the calibration method may actually worsen rather than improve the sensor's performance. Additionally, for sensors which may be used in applications using a large number of measurement recipes and bandwidths, providing calibrations for each possible measurement recipe is cumbersome. In some cases, the application space becomes limited for this reason, rather than hardware limitations. Furthermore, as some sources of sensor errors are common, it is possible that sensor errors have dependencies and removing them step by step may not give the best performance.

To address the problem of asymmetry contribution from contributors other than overlay and bias, e.g., structural asymmetry and/or sensor errors, a scatterometry optical reconstruction methodology is proposed. Such a method uses a model based on the physical principles of intensity signal formation from the diffracted radiation and calculates an overlay value which is more robust to target asymmetry and sensor asymmetries without the need for stack property information. More specifically, the method uses a combination of a scatterometry model and an asymmetry model to account for target asymmetries. The asymmetry model enables calculation of a more accurate overlay value which is more robust to target asymmetry. The scatterometry model may describe each diffraction intensity value (e.g., per measurement recipe) as a function of overlay, measurement recipe and parameters A, B and $\beta$, where parameters A and B represent the amplitude of the interfering waves (as per equation (3) above), and $\beta$ represents the phase difference of the interfering waves. The asymmetry model may describe each diffraction intensity value in terms of one or more $\alpha$ parameters, each $\alpha$ parameter representing an asymmetry contributor other than overlay and bias. The asymmetry model may be varied to consider different effects. Since, both sensor and target asymmetries can cause an error in calculations of overlay or another parameter of interest; the asymmetry model can include sensor asymmetries and target asymmetries. Alternatively the asymmetry model may account for only one of sensor asymmetries and target asymmetries, or will combine the effect of both of these in a single $\alpha$ parameter.

An example of the actual model combination (specific combination of scatterometry model and asymmetry model) according to an embodiment is described by the system of equations shown below, one equation for each of the diffracted intensities $I_{\pm 1, \lambda_j}^{\pm d}$ from the +d and −d biased targets, per wavelength (or measurement recipe) $\lambda_j$:

$$I_{+1,\lambda_j}^{+d} \cong (1+\alpha) \cdot \left[A_{\lambda_j} + B_{\lambda_j} \cdot \cos\left(\beta\frac{\lambda_1}{\lambda_j}\right) \cdot \cos\left(\left(\frac{2\pi}{P}\right) \cdot (OV+d)\right) + \right.$$
$$\left. B_{\lambda_j} \cdot \sin\left(\beta\frac{\lambda_1}{\lambda_j}\right) \cdot \sin\left(\left(\frac{2\pi}{P}\right) \cdot (OV+d)\right)\right]$$

$$I_{-1,\lambda_j}^{+d} \cong (1-\alpha) \cdot \left[A_{\lambda_j} + B_{\lambda_j} \cdot \cos\left(\beta\frac{\lambda_1}{\lambda_j}\right) \cdot \cos\left(\left(\frac{2\pi}{P}\right) \cdot (OV+d)\right) - \right.$$
$$\left. B_{\lambda_j} \cdot \sin\left(\beta\frac{\lambda_1}{\lambda_j}\right) \cdot \sin\left(\left(\frac{2\pi}{P}\right) \cdot (OV+d)\right)\right]$$

$$I_{+1,\lambda_j}^{-d} \cong (1+\alpha) \cdot \left[A_{\lambda_j} + B_{\lambda_j} \cdot \cos\left(\beta\frac{\lambda_1}{\lambda_j}\right) \cdot \cos\left(\left(\frac{2\pi}{P}\right) \cdot (OV-d)\right) + \right.$$
$$\left. B_{\lambda_j} \cdot \sin\left(\beta\frac{\lambda_1}{\lambda_j}\right) \cdot \sin\left(\left(\frac{2\pi}{P}\right) \cdot (OV-d)\right)\right]$$

-continued $$I_{-1,\lambda_j}^{-d} \cong (1-\alpha) \cdot \left[ A_{\lambda_j} + B_{\lambda_j} \cdot \cos\left(\beta \frac{\lambda_1}{\lambda_j}\right) \cdot \cos\left(\left(\frac{2\pi}{P}\right) \cdot (OV-d)\right) - B_{\lambda_j} \cdot \sin\left(\beta \frac{\lambda_1}{\lambda_j}\right) \cdot \sin\left(\left(\frac{2\pi}{P}\right) \cdot (OV-d)\right) \right]$$

Considering first the scatterometry model (in the square brackets of each equation above) the two free amplitude parameters A and B, which represent the amplitude of the interfering waves, are wavelength dependent. Wavelength dependency of the phase difference between interfering waves (phase parameter β) is approximated to be inversely proportional to the wavelength and therefore this phase parameter is only estimated once, for a single wavelength and scaled accordingly for other wavelengths. Overlay OV is, by definition, the same for all wavelengths. Now considering the asymmetry model (first part of each equation), this comprises a asymmetry parameter α, which may represent e.g., target asymmetry and which captures any undesired difference between +1 and −1 orders that is not due to overlay or bias. This parameter is not wavelength or measurement recipe dependent. However, the multiplication of this parameter with parameters A and B results in a combined wavelength dependent asymmetry representation in the model. The difference between the right hand side of the model and the left hand side (measured intensities) may be minimized using a non-linear least square optimization solver.

To calculate the asymmetry parameter α (and overlay OV) different inputs can be used in the model. The minimum number of wavelengths required is two. However, with only two wavelengths, the choice of wavelengths becomes more important. For example, if one of the wavelengths is selected from a region of the swing curve (a plot of stack sensitivity or similar parameter against wavelength) with very low stack sensitivity, the intensity variations may not be sufficient to make the system of equations of the above model stable and robustly solvable. Another problem can occur if the two wavelengths selected as are too close to each other, which can also result in numerical issues. To make the wavelength selection easier for model robustness, using more wavelengths would appear to be a good option. It is feasible to use more than two wavelengths as, in the recipe optimization process used in any case, measurements from many wavelengths are available. Nevertheless, if only two wavelengths are available, it is possible systematically select these wavelengths. This may comprise selecting a pair of wavelengths sufficiently separated; e.g., above a minimum threshold separation, and for which each of the selected wavelengths shows a sufficiently high stack sensitivity; e.g., above a minimum threshold stack sensitivity.

The asymmetry parameter α includes both target asymmetries and in sensor asymmetries. Ideally, therefore, the sensor asymmetry and target asymmetry should be separated, so that the asymmetry parameter is representative of only target asymmetry, independent from any sensor asymmetry and therefore can be used as a target qualifier. In a first embodiment, this may be achieved by first applying current techniques for sensor asymmetry intensity corrections (e.g., the sensor calibration steps already described) and then using the corrected intensities as inputs to the above model. In this way, the asymmetry parameter α will represent only target asymmetry.

In another embodiment, the asymmetry model can include sensor asymmetries in addition to target asymmetries. In this way, the aforementioned sensor calibration steps do not need to be performed, and their drawbacks stated above can be obviated. The resultant system of equations are shown below:

$$I_{+1,\lambda_j}^{+d} \cong (1+\alpha)(1+\alpha_2) \cdot \left[ A_{\lambda_j} + B_{\lambda_j} \cdot \cos\left(\beta \frac{\lambda_1}{\lambda_j}\right) \cdot \cos\left(\left(\frac{2\pi}{P}\right) \cdot (OV+d)\right) + B_{\lambda_j} \cdot \sin\left(\beta \frac{\lambda_1}{\lambda_j}\right) \cdot \sin\left(\left(\frac{2\pi}{P}\right) \cdot (OV+d)\right) \right]$$

$$I_{-1,\lambda_j}^{+d} \cong (1-\alpha)(1+\alpha_2) \cdot \left[ A_{\lambda_j} + B_{\lambda_j} \cdot \cos\left(\beta \frac{\lambda_1}{\lambda_j}\right) \cdot \cos\left(\left(\frac{2\pi}{P}\right) \cdot (OV+d)\right) - B_{\lambda_j} \cdot \sin\left(\beta \frac{\lambda_1}{\lambda_j}\right) \cdot \sin\left(\left(\frac{2\pi}{P}\right) \cdot (OV+d)\right) \right]$$

$$I_{+1,\lambda_j}^{-d} \cong (1+\alpha)(1-\alpha_2) \cdot \left[ A_{\lambda_j} + B_{\lambda_j} \cdot \cos\left(\beta \frac{\lambda_1}{\lambda_j}\right) \cdot \cos\left(\left(\frac{2\pi}{P}\right) \cdot (OV-d)\right) + B_{\lambda_j} \cdot \sin\left(\beta \frac{\lambda_1}{\lambda_j}\right) \cdot \sin\left(\left(\frac{2\pi}{P}\right) \cdot (OV-d)\right) \right]$$

$$I_{-1,\lambda_j}^{-d} \cong (1-\alpha)(1-\alpha_2) \cdot \left[ A_{\lambda_j} + B_{\lambda_j} \cdot \cos\left(\beta \frac{\lambda_1}{\lambda_j}\right) \cdot \cos\left(\left(\frac{2\pi}{P}\right) \cdot (OV-d)\right) - B_{\lambda_j} \cdot \sin\left(\beta \frac{\lambda_1}{\lambda_j}\right) \cdot \sin\left(\left(\frac{2\pi}{P}\right) \cdot (OV-d)\right) \right]$$

The only difference is in the asymmetry model, and more specifically the substitution of the asymmetry parameter α with a first asymmetry parameter $\alpha_1$ and a second asymmetry parameter $\alpha_2$, the first and second asymmetry parameters $\alpha_1$, $\alpha_2$ representing a combination of the effects from both target asymmetries and sensor asymmetries, with the model adjusted accordingly.

The above asymmetry model can be extended further to capture more or all sensor errors (e.g., thereby accounting for both offline and inline calibrations). The extension of this method would involve separating sensor and target asymmetries. Therefore in other embodiments, a more complex sensor asymmetry model may be used, in which all possible errors (with scaling and offset factors) are considered. Such an asymmetry model may comprise more than two asymmetry parameters. The combination of this complex asymmetry model with a scatterometry model will form a new scatterometry optical reconstruction model which can be solved numerically, as described.

Figure 11:
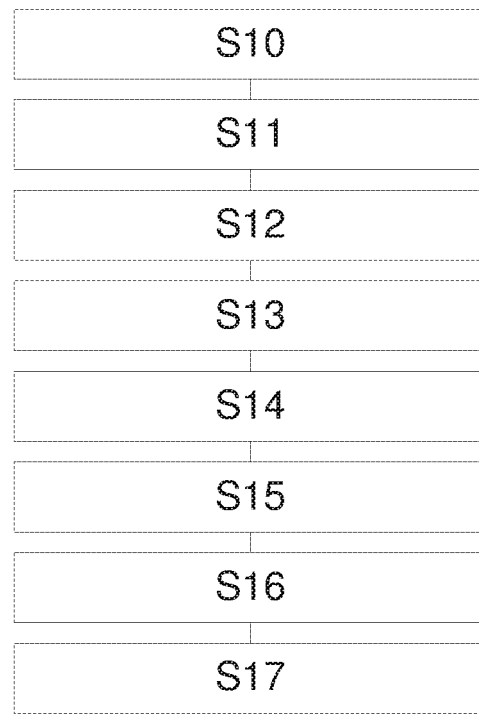
FIG. 11 is a flowchart of a method of measuring a parameter of interest according to an embodiment of the invention.

FIG. 11 is a flowchart of a method according to an embodiment of the invention. The method comprises selecting a scatterometry model S10 and selecting an asymmetry model S11. Steps S12-S14 correspond respectively to steps S1-S4 of FIG. 6 above, to obtain four intensity measurements for a first wavelength/measurement recipe $\lambda_1$: $I_{+1,\lambda_1}^{+d}$, $I_{-1,\lambda_1}^{+d}$, $I_{+1,\lambda_1}^{-d}$, $I_{-1,\lambda_1}^{-d}$. At step S15, steps S12-S14 are repeated j times, i.e., for at least one other wavelength/measurement recipe, depending on the number of unknowns and robustness desired. Clearly the number of measurement recipes should be such that there is sufficient information to solve the unknown model parameters. At step S16, the selected scatterometry model and asymmetry model are combined and, at step S17 the resultant system of model equations are solved for the unknown model parameters and the parameter of interest (e.g., overlay/focus/bottom grating asymmetry/sensor asymmetry etc.), using the measured intensity values $I_{+1,\lambda_j}^{+d}$, $I_{-1,\lambda_j}^{+d}$, $I_{+1,\lambda_j}^{-d}$, $I_{-1,\lambda_j}^{-d}$. This may comprise minimizing the difference between the right hand side of the model equation system and the left hand side (measured intensity values) using a non-linear least square optimization solver.

In another embodiment, a target structure which may be used to determine overlay based on scattered radiation may comprise a form as described in US2016/0291481A1; and in particular as depicted in FIGS. 12 and 18 of that document, and described in the text accompanying these figures. Document US2016/0291481A1 is hereby incorporated by reference in its entirety. Briefly, the target structure includes additional targets other than the four illustrated in FIG. 4 (or more than two targets for an equivalent 1-direction target structure). In one embodiment, the target structure may comprise (for each direction where applicable) two targets based on a line-on-line structures (LoL) each with a bias (e.g., +d, −d), such as depicted in FIG. 4; and additionally two targets based on a line-on-trench structure (LoT), again each having a bias (e.g., the total biases may be P/2+d and P/2−d). Therefore, an equivalent 2-direction target to that depicted in FIG. 4 would have 8 targets: four targets (gratings) periodic in the X direction and four targets gratings periodic in Y, wherein for each direction there are targets having biases +d, −d, P/2+d and P/2−d). In terms of FIG. 7 of document US2016/0291481A1, the component gratings are in two pairs, having the forms (b), (c) and (f), (g).

Measurements of the target structure are obtained in the same way as discussed above. When measuring the intensities diffracted by the individual LoL and LoT targets comprised within the target structure, 8 different intensities are measured, namely: $I_{+1,LoL}^{+d}$, $I_{-1,LoL}^{+d}$, $I_{+1,LoL}^{-d}$, $I_{-1,LoL}^{-d}$, $I_{+1,LoT}^{+d}$, $I_{-1,LoT}^{+d}$, $I_{+1,LoT}^{-d}$, $I_{-1,LoT}^{-d}$, wherein the subscript LoL and LoT describe whether the intensity value relates to a line-on-line or line-on-trench target respectively. In this specific embodiment, the provided formulas relate to measurements at a single wavelength. The asymmetry model to be solved for this specific embodiment is:

$$I_{+1,LoL}^{+d} \cong (1+\alpha) \cdot \left[A^2 + B^2 + 2AB\cos\left(\beta + \left(\frac{2\pi}{P}\right) \cdot (OV+d)\right)\right]$$

$$I_{-1,LoL}^{+d} \cong (1-\alpha) \cdot \left[A^2 + B^2 + 2AB\cos\left(\beta - \left(\frac{2\pi}{P}\right) \cdot (OV+d)\right)\right]$$

$$I_{+1,LoL}^{-d} \cong (1+\alpha) \cdot \left[A^2 + B^2 + 2AB\cos\left(\beta + \left(\frac{2\pi}{P}\right) \cdot (OV-d)\right)\right]$$

$$I_{-1,LoL}^{-d} \cong (1-\alpha) \cdot \left[A^2 + B^2 + 2AB\cos\left(\beta - \left(\frac{2\pi}{P}\right) \cdot (OV-d)\right)\right]$$

$$I_{+1,LoT}^{+d} \cong (1+\alpha) \cdot \left[A^2 + B^2 + 2AB\cos\left(\beta + \left(\frac{2\pi}{P}\right) \cdot \left(OV+\frac{1}{2}P+d\right)\right)\right]$$

$$I_{-1,LoT}^{+d} \cong (1-\alpha) \cdot \left[A^2 + B^2 + 2AB\cos\left(\beta - \left(\frac{2\pi}{P}\right) \cdot \left(OV+\frac{1}{2}P+d\right)\right)\right]$$

$$I_{+1,LoT}^{-d} \cong (1+\alpha) \cdot \left[A^2 + B^2 + 2AB\cos\left(\beta + \left(\frac{2\pi}{P}\right) \cdot \left(OV+\frac{1}{2}P-d\right)\right)\right]$$

$$I_{-1,LoT}^{-d} \cong (1-\alpha) \cdot \left[A^2 + B^2 + 2AB\cos\left(\beta - \left(\frac{2\pi}{P}\right) \cdot \left(OV+\frac{1}{2}P-d\right)\right)\right]$$

In the above model the asymmetry is modeled by asymmetry parameter $\alpha$. More complex asymmetry models may be used, such as those disclosed above. The parameters A, B, P and d have already been discussed in previous embodiments. The above model has 5 unknowns in 8 equations. Therefore, on the basis of a measurement with a single wavelength, the unknowns can be determined, and therefore the overlay value OV can be determined. In line with previously discussed embodiments, this model can be extended to measurements with different wavelengths in a similar manner as discussed in previous embodiments. Measuring with multiple wavelengths may result in a more robust determination of the overlay value.

In a following embodiment, the concepts described herein will be extended to single targets (per direction). There are a number of advantages in using only a single target per direction, which include:

The two-target methods typically used can introduce errors in overlay calculations due to structural asymmetry differences between the two targets (grating imbalance);

Errors due to pattern recognition and ROI identification are doubled for two targets with respect to one target;

Two targets occupy approximately twice the valuable substrate area than one target.

Extending the above teaching to measurement of a single target (e.g., having a bias +d in this example) means that there are only two intensities per wavelength available as inputs into the system of equations. This results in an underdetermined problem; i.e., the number of unknowns will exceed the number of equations. The example below is based on using a single target having a bias +d. However, while a bias is desirable to reduce noise, targets without bias can be used. Also, the direction of the bias is of no consequence.

A physical model can be fitted to the measured intensities through a nonlinear least square of error optimization. In order to reach the global optimal solution for the parameters of the model, prior information should be introduced via regularization techniques. The prior information in this case may comprise a rough estimate of the stack dependent parameters (A, B, and β), which are wavelength dependent (as already discussed), but do not tend to vary much across the substrate (e.g., from target-to-target). Taking advantage of this behavior, a regularization term can be used in the optimization problem, to provide prior information on parameters A, B, and β and to guide the optimization problem around the correct search space for these parameters.

The optimization problem may take the form of:

$$\min_{\substack{A_{\lambda_i} \\ \vdots \\ x = \begin{pmatrix} A_{\lambda_i} \\ \vdots \\ A_{\lambda_j} \\ B_{\lambda_i} \\ \vdots \\ A_{\lambda_j} \\ \beta \\ \alpha \\ OV \end{pmatrix}}} \sum_{i=1}^{2j} (F_i(x) - I_{mean,i})^2 +$$

$$\gamma\left(\sum_{i=1}^{j}(A_{\lambda_i} - A_{\lambda_i}^*)^2 + \sum_{i=1}^{j}(B_{\lambda_i} - \beta_{\lambda_i}^*)^2 + (\beta - \beta^*)^2\right)$$

s.t. $lb \leq x \leq ub$ where $I_{mean}$ is an average of the measured intensities, i.e.:

$$I_{mean} = \begin{cases} I_{+1,\lambda_1}^{+d} \\ \vdots \\ I_{+1,\lambda_j}^{+d} \\ \vdots \\ I_{-1,\lambda_1}^{+d} \\ \vdots \\ I_{-1,\lambda_j}^{+d} \end{cases}$$

and the physical model may take the form, where the top two equations of the model relate to the normal (e.g., +1) diffraction order and the bottom two equations relate to the complementary (e.g., −1) diffraction order:

$$F = \begin{cases} (1+\alpha) \cdot \left[ A_{\lambda_1} + B_{\lambda_1} \cos\left(\beta + \left(\frac{2\pi}{P}\right) \cdot (OV+d)\right) \right] \\ (1+\alpha) \cdot \left[ A_{\lambda_j} + B_{\lambda_j} \cos\left(\beta \frac{\lambda_1}{\lambda_j} + \left(\frac{2\pi}{P}\right) \cdot (OV+d)\right) \right] \\ (1-\alpha) \cdot \left[ A_{\lambda_1} + B_{\lambda_1} \cos\left(\beta - \left(\frac{2\pi}{P}\right) \cdot (OV+d)\right) \right] \\ (1-\alpha) \cdot \left[ A_{\lambda_1} + B_{\lambda_1} \cos\left(\beta \frac{\lambda_1}{\lambda_j} - \left(\frac{2\pi}{P}\right) \cdot (OV+d)\right) \right] \end{cases}$$

A number of ways for making an initial estimate of the parameters are proposed. One proposal comprises providing on the substrate, and measuring, one conventional two-bias target structure (e.g., per direction such as that illustrated in FIG. 4), from which a rough estimate of these parameters may be made (e.g., using techniques already described). In another proposal, more than one two-bias target structures are provided. For example, one two-bias target structure may be provided per-field to capture stack variation across the substrate. In another embodiment, instead of providing a dedicated two-bias target structure, the prior information can be captured by co-optimizing two neighboring single-target target structures and adding an additional constraint which limits deviation of the A, B and β parameter values relating to each of the two single targets (i.e., constrains these parameter values to be close for each of the targets).

It can be demonstrated that a rough estimate of the A, B and β parameters is sufficient, and the optimization scheme is able to further optimize the parameters for each target, so as to capture stack and other diffraction variations associated with each target and measurement wavelength. Moreover, the other, more interesting, parameters (overlay OV and asymmetry parameter α) are not constrained via regularization and therefore have a much larger search space. This is consistent with the simulation results presented in the next section.

In the above model the asymmetry is modeled by asymmetry parameter α. More complex asymmetry models may be used, such as those disclosed above.

Finally, the concept can be adapted and extended to other overlay calculation models (even those corresponding to measurement with single wavelength) and is not limited to the choice of model presented here. This includes the simplified model currently used for overlay calculation with a single good wavelength (e.g., as described by Equations (1) and (2), appropriately modified to accommodate only a single target (e.g., with only a single bias). More importantly, the generic method presented here, also incorporates any sensor model description which can be adapted for future.

In an embodiment, the system of equations comprises 3*NWL+3 unknowns, wherein the NWL is the number of wavelengths. In this case, a minimum number of wavelengths necessary to solve the system of equations is 4*NWL. In an embodiment, the condition is expressed as 4*NWL≥3*n+3. In this particular example, 2 wavelengths would not provide a system of equations which is solvable. In this particular example, 3 wavelengths would be a minimum number of wavelengths which assures that the system of equations is solvable. In a further embodiment, one may choose to augment the system of equations such that it comprises α parameter which is proportional to the degree of geometrical asymmetry of the grating or grating imbalance. In this embodiment, the condition which assures that the system of equations is solvable is given by 4*NWL≥3*n+3.

In an embodiment, the system of equations comprises 2*NWL+3 unknowns, wherein the NWL is the number of wavelengths. In this case, a minimum number of wavelengths necessary to solve the system of equations is 4*NWL. In an embodiment, the condition is expressed as 4*NWL≥2*n+3. In this particular example, 1 wavelength does not assure that the system of equations is solvable. In this particular example, 2 wavelengths is the minimum number of wavelengths which assures that the system of equations is solvable.

In an embodiment, the measured intensity I is the average values for all the pixels in one of the images in FIG. 5, P1 for example. In an embodiment, each pixel in one of the images in FIG. 5 may be used to create system of equations. In an embodiment, cluster of pixels may be selected which provide an average intensity, for that particular cluster. In an embodiment, the system of equations comprises 2*NWL*c+1 unknowns, wherein the NWL is the number of wavelengths, and c is the number of clusters formed from a single image, such as image P1 in FIG. 5. In this case, a minimum number of wavelengths necessary to solve the system of equations is 2*NWL*c. In an embodiment, the condition is expressed as 2*NWL*c≥2*NWL+c+1. In this particular example, 1 wavelength does not assure that the system of equations is solvable for the case of 2 clusters. In this particular example, 2 wavelengths is the minimum number of wavelengths which assures that the system of equations is solvable for 2 clusters.

In an embodiment, the system of equations comprises 3*NWL+4 unknowns, wherein the NWL is the number of wavelengths. In this case, a minimum number of wavelengths necessary to solve the system of equations is 8*NWL. In an embodiment, the condition is expressed as 4*NWL≥2*n+3. In this particular example, 1 wavelength does not assure that the system of equations is solvable. In this particular example, 2 wavelengths is the minimum number of wavelengths which assures that the system of equations is solvable.

In an embodiment, the optimization necessary to solve the system of equations described in previous embodiments may be expressed in a linear fashion, subject to linear scalar and matrix inequalities. In an example, the optimization procedure is Semi-definite programming (SDP). The SDP optimization procedure may be solved by efficient and fast global solvers, which are known in the art. In an embodiment, the cost function which undergoes the optimization procedure has a convex behavior with respect to the variation of overlay. In other words, it has a minimum as a function of overlay. Therefore, in order to solve the overall overlay estimation problem, one may perform a bisection search on overlay, which may be described as an efficient SDP problem. The bounds of the bisection method may be chosen arbitrary, in an example between −20 nm and 20 nm. The first step in the bisection method is to solved the SDP optimization for an upper bound, a lower bound and a point in the middle of the interval for overlay. In a subsequent step, one compares the optimized objective functions for these fixed overlay values, remove the one having the highest values, and, within the half interval, solve the SDP optimization for the overlay value in the middle of the interval. These two steps are repeated until the overlay value has a desired accuracy. In a typical example, 5 to 7 SDP optimization routines are necessary to obtain a values of overlay with the desired accuracy.

As such, there is disclosed a method of measuring a parameter of interest relating to a single target per direction, having at least two layers, comprising:

illuminating the target with measurement radiation and detecting scattered radiation having been scattered by said target, and obtaining a measured parameter value (e.g., intensity value) relating to each of normal and complementary higher diffraction orders of the scattered radiation;

defining a model relating to the target;

fitting the measured parameter values to the model so as to determine the parameter of interest, wherein said fitting comprises:

estimating values for one or more target dependent parameters; and using these estimated values as a constraint in the fitting step.

The estimated values may be obtained from either: a target structure comprising two targets; or two proximate single targets, said estimated values being constrained to minimize variation of the estimated values between the two proximate single targets.

In summary, a strong link between target asymmetry and the asymmetry parameter of the asymmetry model has been determined without requiring information regarding stack geometry, material, etc. Furthermore, this relation is independent of polarization and stack properties and is robust over measurement recipe selection. In addition, a method which enables removal of offline sensor calibrations is described. Previously, offline sensor calibrations were considered the best solution for improving overlay accuracy, although, it was recognized that this would inevitably introduce some new errors. By using multi-acquisition algorithm with optical reconstruction using the model described herein, or a similar model, offline sensor calibrations become redundant.

While the target structures described above are metrology target structures specifically designed and formed for the purposes of measurement, in other embodiments, properties may be measured on target structures which are functional parts of devices formed on the substrate. Many devices have regular, grating-like structures. The terms 'target grating' and 'target structure' as used herein do not require that the structure has been provided specifically for the measurement being performed. Further, pitch P of the metrology target structures is close to the resolution limit of the optical system of the scatterometer, but may be much larger than the dimension of typical product features made by lithographic process in the target portions C. In practice the lines and/or spaces of the overlay gratings within the target structures may be made to include smaller structures similar in dimension to the product features.

In association with the physical grating structures of the target structures as realized on substrates and patterning devices, an embodiment may include a computer program containing one or more sequences of machine-readable instructions describing methods of measuring target structures on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to calculate overlay error or other parameters with reduced sensitivity to other asymmetry errors.

The program may optionally be arranged to control the optical system, substrate support and the like to perform the steps S2-S4 for measuring a suitable plurality of target structures.

While the embodiments disclosed above are described in terms of diffraction based overlay measurements (e.g., measurements made using the second measurement branch of the apparatus shown in FIG. 3(a)), in principle the same models can be used for pupil based overlay measurements (e.g., measurements made using the first measurement branch of the apparatus shown in FIG. 3(a)). Consequently, it should be appreciated that the concepts described herein are equally applicable to diffraction based overlay measurements and pupil based overlay measurements.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments according to the present invention are further described in below numbered clauses:

1. A method of measuring a parameter of interest relating to a structure having at least two layers, comprising:

illuminating the structure with measurement radiation and detecting scattered radiation having been scattered by said structure, wherein the scattered radiation comprises normal and complementary higher diffraction orders;

defining a scatterometry model and an asymmetry model relating to the structure, wherein:

said scatterometry model relates a scattered radiation parameter to at least α parameter of interest; and said asymmetry model relates the scattered radiation parameter to at least one asymmetry parameter, said at least one asymmetry parameter relating to one or more measurement system errors and/or an asymmetry in the target other than a misalignment between the two layers;

using a combination of the scatterometry model and asymmetry model to determine a system of equations, each equation of said system of equations relating to a different measurement value of a set of measurement values for said scattered radiation parameter, said set of measurement values comprising at least a different measurement value for each of said normal and complementary higher diffraction orders; and solving said system of equations for said parameter of interest.

2. A method according to clause 1, wherein the illumination and detection step is performed for two or more wavelengths and said set of measurement values for said scattered radiation parameter comprise a measurement value for each of said normal and complementary higher diffraction orders relating to each of said two or more wavelengths.

3. A method according to clause 2, wherein said illumination and detection step is a single step using multi-wavelength measurement radiation comprising said two or more wavelengths.

4. A method according to clause 2, wherein said illumination and detection step comprises separate illumination and detection steps for each of said two or more wavelengths.

5. A method according to any of clauses 2 to 4, wherein the illumination and detection step is performed for only a pair of wavelengths and the wavelengths of said pair of wavelengths are separated by a minimum threshold separation, and wherein each of the selected wavelengths shows a stack sensitivity above a minimum threshold stack sensitivity.

6. A method according to any preceding clause, wherein said parameter of interest comprises overlay and said misalignment between the two layers comprises a combination of overlay and a deliberate bias.

7. A method according to clause 6, wherein said structure comprises a target having at least two periodic sub-targets, each sub-target having a different deliberate bias, and said set of measurement values for said scattered radiation parameter comprise a measurement value for each of said normal and complementary higher diffraction orders relating to each sub-target.

8. A method according to clause 7, wherein said at least two sub-targets each have a deliberate bias of equal magnitude but opposite direction.

9. A method according to clause 7 or 8, wherein said at least two periodic sub-targets comprise line-on-line periodic sub-targets, wherein the lines of gratings of which the line-on-line periodic sub-targets are comprised are substantially aligned except for the offset imposed by said deliberate bias, and said structure further comprises at least two additional line-on-space periodic sub-targets, each having a bias of half the pitch of said gratings in addition to the deliberate bias of the corresponding line-on-line periodic sub-target.

10. A method according to any of clauses 1 to 6, wherein said structure comprises a single target, and said solving the system of equations comprises estimating values for one or more target dependent parameters; and using these estimated values as a constraint in the solving step.

11. A method according to clause 10, wherein the estimated values are obtained from either:

a target structure comprising two targets; or two proximate single targets, said estimated values being constrained to minimize variation of the estimated values between the two proximate single targets.

12. A method according to any preceding clause, wherein said at least one asymmetry parameter comprises a single asymmetry parameter relating to an asymmetry in the target other than said misalignment between the two layers.

13. A method according to clause 12, comprising an initial step of performing a detector calibration to correct for said measurement system error.

14. A method according to any of clauses 1 to 11, wherein said at least one asymmetry parameter comprises at least a first asymmetry parameter and a second asymmetry parameter, said first asymmetry parameter and second asymmetry parameter relating to a combination of asymmetry in the target other than a misalignment between the two layers and to one or more measurement system errors.

15. A method according to clause 14, wherein said one or more measurement system errors relate to asymmetrical errors in a detector used to detect said scattered radiation.

16. A method according to any preceding clause, wherein said scatterometry model further relates said scattered radiation parameter to amplitude parameters representing the amplitude of the interfering waves in the scattered radiation and a phase parameter representing the phase difference between interfering waves in the scattered radiation.

17. A method according to clause 16, wherein the phase parameter is determined for only a single wavelength and scaled in each equation according to an assumption that the phase parameter is inversely proportional to the wavelength.

18. A method according to any preceding clause, wherein said scattered radiation parameter comprises an intensity metric of the scattered radiation.

19. A method according to any preceding clause, wherein the step of solving the system of equations comprises minimizing the difference between the set of measurement values and the combination of the scatterometry model and asymmetry model over the system of equations.

20. A method according to clause 19, wherein the step of minimizing the difference comprises using a non-linear least square optimization solver.

21. An inspection apparatus for measuring a parameter of interest of a lithographic process, the inspection apparatus being operable to perform the method of any preceding clause.

22. A non-transitory computer program product comprising machine-readable instructions for causing a processor to cause performance of the method of any of clauses 1 to 20.

23. A system comprising:

an inspection apparatus configured to provide a beam of measurement radiation on a target on a substrate and to detect radiation scattered by the target to determine a parameter of interest of a patterning process; and the non-transitory computer program product of clause 22.

24. The system of clause 23, further comprising a lithographic apparatus having a support structure configured to hold a patterning device to modulate a radiation beam and a projection system arranged to project the modulated radiation beam onto a radiation-sensitive substrate;

wherein said lithographic apparatus is operable to use said parameter of interest in a patterning process on subsequent substrates.

Further embodiments according to the present invention are described in below numbered clauses:

I A method of measuring a parameter of interest relating to a single target, having at least two layers, comprising:

illuminating the target with measurement radiation and detecting scattered radiation having been scattered by said target, and obtaining a measured parameter value relating to each of normal and complementary higher diffraction orders of the scattered radiation;

defining a model relating to the target;

fitting the measured parameter values to the model so as to determine the parameter of interest, wherein said fitting comprises:

estimating values for one or more target dependent parameters; and using these estimated values as a constraint in the fitting step.

II A method as described in clause I wherein the estimated values are obtained from either:

a target structure comprising two targets; or two proximate single targets, said estimated values being constrained to minimize variation of the estimated values between the two proximate single targets.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a parameter of interest relating to a structure having at least two layers, comprising:

illuminating the structure with measurement radiation and detecting scattered radiation having been scattered by the structure, wherein the scattered radiation comprises normal and complementary higher diffraction orders;

defining a scatterometry model and an asymmetry model relating to the structure, wherein:

the scatterometry model relates a scattered radiation parameter to at least a parameter of interest; and the asymmetry model relates the scattered radiation parameter to at least one asymmetry parameter, the at least one asymmetry parameter relating to one or more measurement system errors and/or an asymmetry in the target other than a misalignment between the two layers;

using a combination of the scatterometry model and the asymmetry model to determine a system of equations, each equation of the system of equations relating to a different measurement value of a set of measurement values for the scattered radiation parameter, the set of measurement values comprising at least a different measurement value for each of the normal and complementary higher diffraction orders; and solving the system of equations for the parameter of interest.

2. The method of claim 1, wherein:

the illumination and detection is performed for two or more wavelengths; and the set of measurement values for the scattered radiation parameter comprises a measurement value for each of the normal and complementary higher diffraction orders relating to each of the two or more wavelengths.

3. The method of claim 2, wherein the illumination and detection is a single step using multi-wavelength measurement radiation comprising the two or more wavelengths.

4. The method of claim 2, wherein the illumination and detection comprises separate steps for each of the two or more wavelengths.

5. The method of claim 2, wherein:

the illumination and detection is performed for only a pair of wavelengths and the wavelengths of the pair of wavelengths are separated by a minimum threshold separation, and each of the selected wavelengths shows a stack sensitivity above a minimum threshold stack sensitivity.

6. The method of claim 1, wherein the parameter of interest comprises overlay and the misalignment between the two layers comprises a combination of overlay and a deliberate bias.

7. The method of claim 6, wherein:

the structure comprises a target having at least two periodic sub-targets, each sub-target having a different deliberate bias, and the set of measurement values for the scattered radiation parameter comprises a measurement value for each of the normal and complementary higher diffraction orders relating to each sub-target.

8. The method of claim 7, wherein the at least two sub-targets each have a deliberate bias of equal magnitude but opposite direction.

9. The method of claim 1, wherein the at least one asymmetry para comprises a single asymmetry parameter relating to an asymmetry in the target other than the misalignment between the two layers.

10. The method of claim 9, comprising an initial step of performing a detector calibration to correct for the measurement system error.

11. The method of claim 1, wherein the at least one asymmetry parameter comprises at least a first asymmetry parameter and a second asymmetry parameter, the first asymmetry parameter and second asymmetry parameter relating to a combination of asymmetry in the target other than a misalignment between the two layers and to one or more measurement system errors.

12. The method of claim 1, wherein the one or more measurement system errors relate to asymmetrical errors in a detector used to detect the scattered radiation.

13. The method of claim 1, wherein the scatterometry model further relates the scattered radiation parameter to amplitude parameters representing the amplitude of the interfering waves in the scattered radiation and a phase parameter representing the phase difference between interfering waves in the scattered radiation.

14. The method of claim 13, wherein the phase parameter is determined for only a single wavelength and scaled in each equation according to an assumption that the phase parameter is inversely proportional to the wavelength.

15. The method of claim 1, wherein the scattered radiation parameter comprises an intensity metric of the scattered radiation.

\* \* \* \* \*

UNITED STATES PATENT AND TRADEMARK OFFICE
CERTIFICATE OF CORRECTION

PATENT NO. : 10,705,437 B2
APPLICATION NO. : 16/155424
DATED : July 7, 2020
INVENTOR(S) : Javaheri et al.

Page 1 of 1

It is certified that error appears in the above-identified patent and that said Letters Patent is hereby corrected as shown below:

In the Claims

In Column 26, Line 44, Claim 9, please replace "asymmetry para" with --asymmetry parameter--.

Signed and Sealed this
Twenty-ninth Day of September, 2020

Andrei Iancu
*Director of the United States Patent and Trademark Office*